US012640336B2

(12) United States Patent \
Tanigaki et al.

(10) Patent No.: US 12,640,336 B2 \
(45) Date of Patent: May 26, 2026

(54) SAMPLE HOLDER AND ELECTRON MICROSCOPE

(71) Applicant: Hitachi, Ltd., Tokyo (JP)

(72) Inventors: Toshiaki Tanigaki, Tokyo (JP); Akira Sugawara, Tokyo (JP); Fumiaki Ichihashi, Tokyo (JP)

(73) Assignee: Hitachi. Ltd., Tokyo (JP)

( * ) Notice: Subject to any disclaimer, the term of this patent is extended or adjusted under 35 U.S.C. 154(b) by 352 days.

(21) Appl. No.: 18/588,347

(22) Filed: Feb. 27, 2024

(65) Prior Publication Data

US 2024/0404781 A1     Dec. 5, 2024

(30) Foreign Application Priority Data

May 31, 2023    (JP) ................................. 2023-089321

(51) Int. Cl.
   *H01J 37/20*      (2006.01)
   *H01J 37/26*      (2006.01)

(52) U.S. Cl.
   CPC .............. *H01J 37/20* (2013.01); *H01J 37/26* (2013.01); *H01J 2237/2003* (2013.01); *H01J 2237/2005* (2013.01); *H01J 2237/204* (2013.01)

(58) Field of Classification Search
   CPC .... H01J 37/20; H01J 37/26; H01J 2237/2003; H01J 2237/2005; H01J 2237/204
   See application file for complete search history.

(56) References Cited

U.S. PATENT DOCUMENTS

| | | | |
|---|---|---|---|
| 2008/0283748 A1 | 11/2008 | Matsumoto et al. | |
| 2013/0213439 A1* | 8/2013 | Zandbergen ............ | H01J 37/20 134/21 |
| 2013/0264476 A1 | 10/2013 | Damiano, Jr. et al. | |

FOREIGN PATENT DOCUMENTS

| | | |
|---|---|---|
| JP | 2008-171774 A | 7/2008 |
| JP | 2018-085349 A | 5/2018 |

* cited by examiner

*Primary Examiner* — Sean Luck

(74) *Attorney, Agent, or Firm* — Miles & Stockbridge, P.C.

(57) ABSTRACT

There are provided a sample holder that allows in-situ observation of a sample such as a gas or liquid under light irradiation and an electron microscope. An environment cell is formed in combination of two silicon chips, each including a membrane and a frame supporting the membrane, the frame being provided on the opening. The environment cell is accommodated in a main body of the sample holder, and fixed by a lid. The openings of the lid, the two silicon chips, and the main body are placed so as to overlap with each other along the optical axis of an electron beam of an electron microscope. A light emitting element is placed at a position where any one of the openings of the two silicon chips is allowed to be irradiated with light.

11 Claims, 6 Drawing Sheets

SAMPLE HOLDER AND ELECTRON MICROSCOPE

CROSS-REFERENCE TO RELATED APPLICATION

This application claims priority to Japanese Patent Application No. 2023-089321 filed on May 31, 2023, the entire contents of which are incorporated by reference herein.

BACKGROUND OF THE INVENTION

The present invention relates to a sample holder that observes a sample in a gas or liquid, and an electron microscope equipped with the same.

Background

One of the needs for electron microscopy in the environmental field is, for example, the analysis of photocatalysts for artificial photosynthesis and hydrogen production. In order to perform in situ observation of photocatalysts, it is necessary to place a photocatalyst sample in a liquid or gas and observe the photocatalysts while irradiating the photocatalysts with light.

Japanese Unexamined Patent Application Publication No. 2018-85349 discloses a sample holder that introduces a gas or liquid into a sample in order to allow in-situ observation under various environments, or enables electrical contact for electrochemical or thermal experiments.

Japanese Unexamined Patent Application Publication No. 2008-171774 discloses an electron microscope that can locally heat a sample using laser light. As the electron microscope, for example, a transmission electron microscope (TEM) is assumed, and a sample holder on which a sample is placed is inserted into the gap between the upper magnetic pole of an objective lens and the lower magnetic pole of the objective lens. For this reason, an optical fiber holder is attached to the electron microscope to introduce an optical fiber into the same gap. The fine movement mechanism of the optical fiber holder adjusts the light spot from the optical fiber to illuminate the sample.

SUMMARY OF THE INVENTION

Japanese Unexamined Patent Application Publication No. 2018-85349 does not disclose observing a sample under light irradiation. For example, when considering irradiating a sample with light using an optical fiber as disclosed in Japanese Unexamined Patent Application Publication No. 2008-171774, the following problems arise.

First, it is necessary to equip the electron microscope with an optical fiber holder, which leads to the necessity of large-scale remodeling of the equipment. Also, unlike the case of Japanese Unexamined Patent Application Publication No. 2008-171774 in which laser light is irradiated for heating, for in-situ observation of photocatalysts, it is necessary to irradiate the sample (photocatalyst) with white light or ultraviolet light with an intensity equivalent to that of sunlight. For this reason, it is necessary to focus the light introduced into the electron microscope using an optical fiber onto the sample. However, in the TEM or scanning transmission electron microscope (STEM), as mentioned above, the sample holder is inserted into the gap between an objective lens upper magnetic pole and an objective lens lower magnetic pole, and the larger the gap becomes, the lower the resolution of the device becomes. When the technology disclosed in Japanese Unexamined Patent Application Publication No. 2018-85349, and the technology disclosed in Japanese Unexamined Patent Application Publication No. 2008-171774 are combined, in addition to a sample holder in the gap between the objective lens upper magnetic pole and the objective lens lower magnetic pole, it is necessary to incorporate an optical fiber holder and collection optics that irradiates light, and it is difficult to perform in-situ observation of photocatalysts while irradiating a sample with high luminous light without reducing the resolution of the electron microscope.

A sample holder in one embodiment of the present invention that holds an environment cell enclosing a sample, which is an observation target by an electron microscope, the sample holder comprising: a main body provided with a recess capable of accommodating the environment cell; a lid that fixes the environment cell accommodated in the recess: and a light irradiation unit that irradiates the sample with light. In the sample holder, an opening is provided to a bottom surface of the recess of the main body and to the lid respectively: the environment cell is formed in combination of a first silicon chip and a second silicon chip, each including a membrane and a frame supporting the membrane, the frame being provided on the opening, in which a space enclosing the sample between the membrane of the first silicon chip and the membrane of the second silicon chip: and an opening of the lid, an opening of the first silicon chip, an opening of the second silicon chip, and an opening of the main body are located so as to overlap with each other along an optical axis of an electron beam of the electron microscope, the second silicon chip is arranged on the main body via a sealing material, the lid is fixed to the first silicon chip and the main body via sealing materials, and the light irradiation unit includes a light emitting element is placed at a position where the opening of the first silicon chip or the opening of the second silicon chip is allowed to be irradiated with light.

It is possible to equip the sample holder with a light irradiation function without hardly changing the thickness of the sample holder. Other objects and novel features will become apparent from the description of the present specification and the accompanying drawings.

DETAILED DESCRIPTION OF THE PREFERRED EMBODIMENTS

Figure 1:
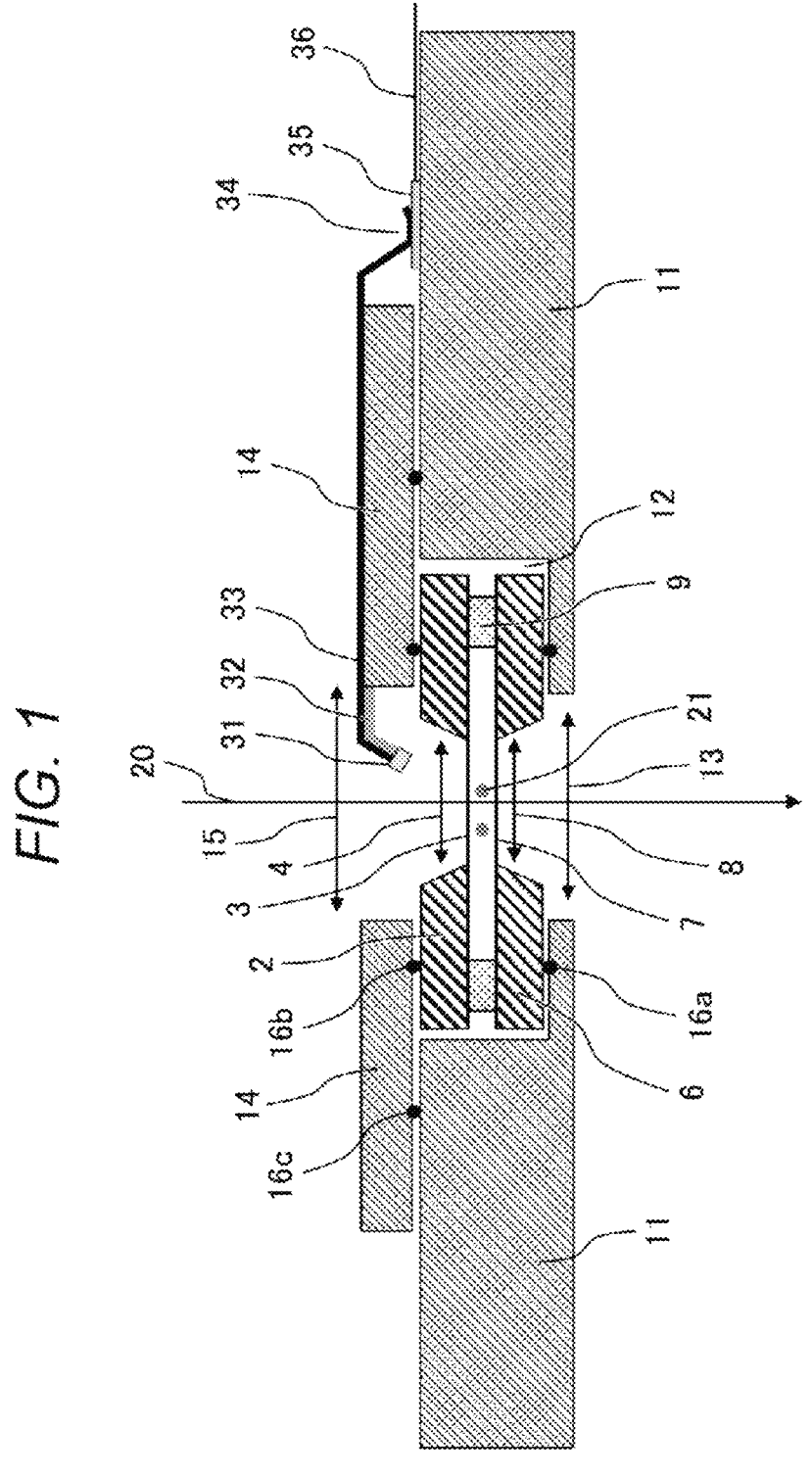
FIG. 1 is a schematic diagram of a sample holder (part) having a light irradiation function.

In the following, an embodiment of the present invention will be described below with reference to the drawings. However, the present invention should not be interpreted as being limited to the contents described in the embodiment shown below. Those skilled in the art will easily understand that the specific configuration can be changed without deviating from the idea or gist of the present invention. Furthermore, in the configuration of the invention described below, the same reference numerals are used in common between different drawings for the same parts or parts having similar functions, and redundant explanations may be omitted.

Figure 2:
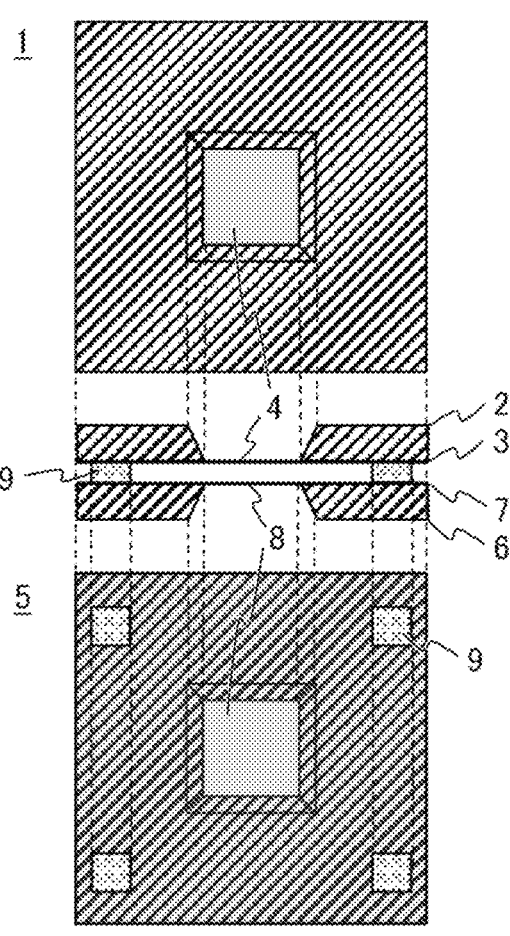
FIG. 2 is a schematic diagram that explains the configuration of an environment cell.

FIG. 1 shows an extracted portion of a sample holder having a light irradiation function according to the present embodiment, which holds an environment cell. Here, as an example of an environment cell, an example configuration is shown in which two silicon chips (in the following, referred to as Si chips) 1 and 5 are combined. Referring to FIG. 2, the configuration of the environment cell of the present embodiment will be described. In the center of FIG. 2, a cross section of the environment cell in which an upper Si chip 1 and a lower Si chip 5 are combined, a plan view of the upper Si chip 1 is shown above, and a plan view of the lower Si chip 5 is shown below. Each of the plan views shows a plan view of two Si chips combined to form an environment cell and viewed from the direction of an electron source when installed in an electron microscope.

The basic configuration of the upper Si chip 1 and the lower Si chip 5 is the same, and each includes a membrane 3 (7) and a frame 2 (6) that supports the membrane. The frame 2 (6) is formed with an opening 4 (8). Note that the thickness of the frame is approximately 200 μm. Furthermore, a spacer 9 is formed in the lower Si chip 5 to form a space in which a sample is enclosed. For example, the frame 2 (6) is made of single crystal Si, the membrane 3 (7) is a SiN thin film, and the spacer 9 is made of metal such as gold (Au), the Si chip can be manufactured using semiconductor processing technology: Furthermore, by using the Si chip as a MEMS chip with a heater that heats the sample and/or electrodes that applies voltage to the sample which formed on the membrane, it is possible to control the environment of the sample to be observed in an even more diverse manner.

FIG. 1 shows the environment cell shown in FIG. 2 fixed to the sample holder. The sample holder includes a main body 11 provided with a recess 12 capable of accommodating an environment cell, and a lid 14 that fixes the environment cell arranged in the recess 12, and the bottom surface of the recess 12 of the main body 11 and the lid 14 are provided with openings 13 and 15, respectively. The environment cell is fixed to the sample holder such that the opening 15 of the lid 14, an opening 4 of the upper Si chip 1, an opening 8 of the lower Si chip 5, and the opening 13 of the main body 11 overlap with each other along an optical axis 20 of the electron beam, in order that the electron beam can pass the space enclosing the sample of the environment cell. At this time, in order to maintain the airtightness of the space in which the sample of the environmental cell is enclosed, the frame 6 of the lower Si chip 5 is arranged in the main body 11 via an O-ring (sealing material) 16a, and the lid 14 is fixed to the frame 2 of the upper Si chip 1 and the main body 11 respectively via O-rings 16b, and 16c.

The region sandwiched between a membrane 3 and a membrane 7 of the environment cell is a space in which a sample 21 is enclosed. It is possible to supply a gas or liquid to the space in which the sample 21 is sealed through piping built into the main body 11 depending on the contents of the in-situ observation.

In the present embodiment, the sample holder is provided with a light irradiation unit to irradiate the sample 21 with light. The light irradiation unit includes a light emitting element 31 provided on the lid 14, a support member 32 that supports the light emitting element 31, a lid side wiring (first wiring) 33 that supplies a power source for causing the light emitting element 31 to emit light, to which a lid side electrode (first electrode) 34 is connected to its end, and main body side wiring (second wiring) 36 that supplies a power source for causing the light emitting element 31 to emit light, to which a main body side electrode (second electrode) 35 is connected to its end. By fixing the lid 14 to the main body 11 and connecting the lid side electrode 34 to the main body side electrode 35, the sample 21 in the environmental cell can be irradiated with light.

As the light emitting element 31, a semiconductor light emitting element such as a light emitting diode (LED) is desirably used because the light emitting diode can emit light in the range of visible light to ultraviolet light and can emit high luminous light with small size and low power. By placing the light emitting element near the sample 21, this makes it possible to irradiate the sample 21 with higher luminous light than when light is introduced through an optical fiber.

Further, the arrangement position of the light emitting element 31 is not particularly limited as long as the opening 4 of the upper Si chip 1 is irradiated with light. However, it is desirable to place the light emitting element 31, wiring, and the like constituting the light irradiation unit so as to avoid the optical axis 20 of the electron beam such that the irradiation of the electron beam is not obstructed. In the example shown in FIG. 1, the light emitting element 31 is attached to the lid 14 via the support member 32, adjustment is provided such that the sample 21 is irradiated with a higher luminous light. Specifically, the details are as follows.

(1) Since the opening 15 of the lid 14 is larger than the opening 4 of the upper Si chip 1, the light emitting element 31 is made to protrude toward the optical axis 20 side from the edge of the opening 15 of the lid 14 by the support member 32.

(2) Since the lid side wiring 33 is arranged to pass through the top surface of the lid 14, the light emitting element 31 is arranged below the top surface of the lid 14 by the support member 32.

(3) The light emitted by the light emitting element 31 has directivity. For this reason, the light emitting element 31 is attached to the support member 32 such that the sample 21 is located in the direction where the light quantity of the light emitting element 31 is high. By configuring the light emitting element 31 and the support member 32 so as to satisfy any one or more of the above (1) to (3), it becomes possible to irradiate higher luminous light. For example, it is possible to irradiate the sample with brightness equal or higher brightness as sunlight.

By configuring the light irradiation unit in this way, since it is possible to irradiate the sample with light even though the thickness is almost the same as that of a sample holder without a light irradiation function, it is possible to achieve in-situ observation while irradiating the sample with high luminous light without reducing the resolution of the electron microscope. Furthermore, it is not necessary to modify the electron microscope, and it is only necessary to mount a light irradiation unit with a simple structure on the sample holder, and thus it is possible to achieve the configuration at low cost. Modifications of the sample holder having a light irradiation function will be described below.

Modification 1

In the case in which the electromagnetic field of a sample is analyzed using electron holography, differential phase

Figure 3:
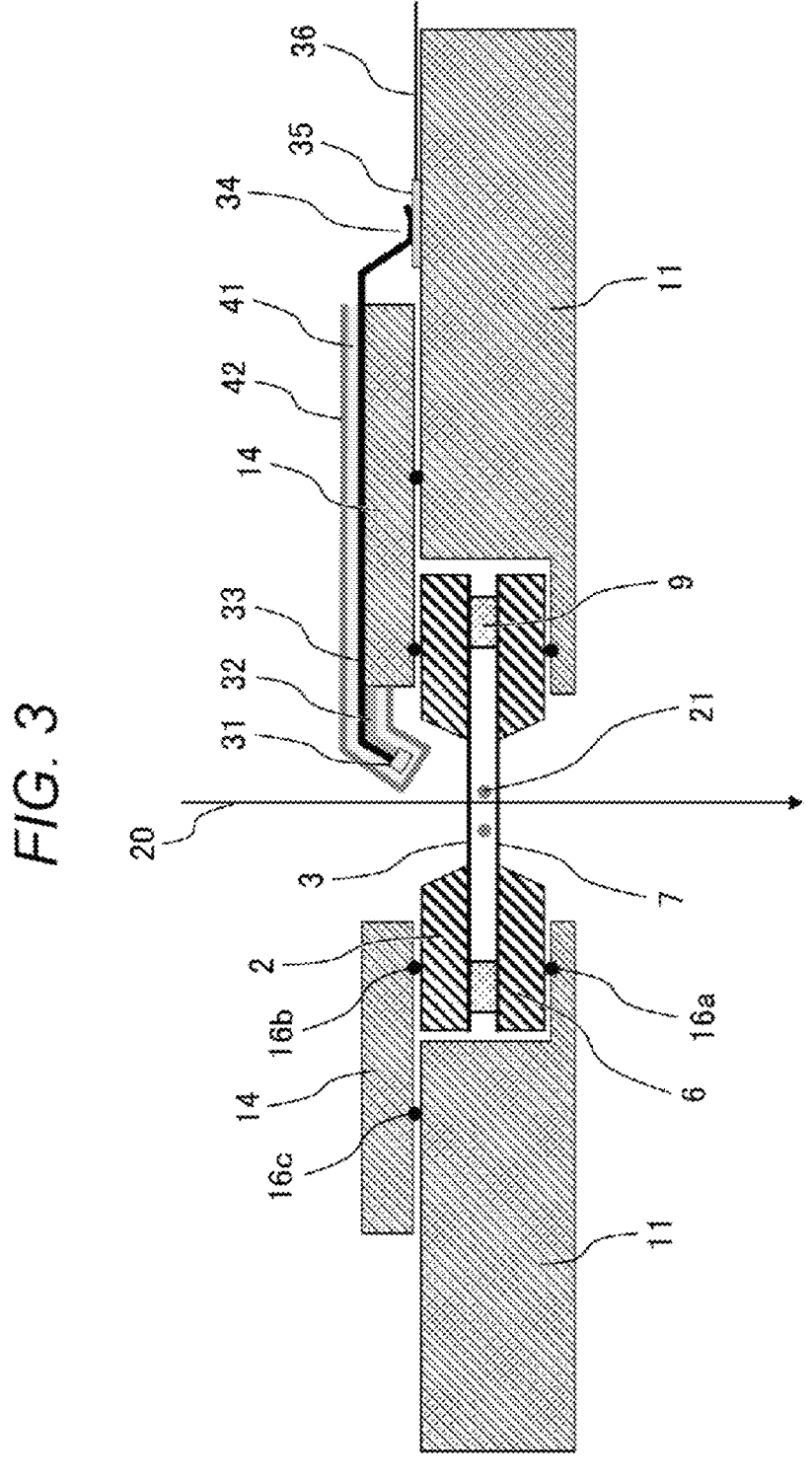
FIG. 3 is a schematic diagram of a sample holder (part) having a light irradiation function.

5 contrast method, and the like, the electric field and charge around the observation position affect the observation. For this reason, desirably, the current applied to make the light emitting element 31 glow does not cause a short circuit and the light emitting element 31 and its surrounding members are not charged. FIG. 3 shows a configuration example in which the light irradiation unit has an antistatic function. Specifically, at least a part of the light emitting element 31, the support member 32, and the lid side wiring 33 are covered with a thin insulating film 41, and further covered with a conductive film 42 from above. As a result, since the electric charge generated in the light irradiation unit flows from the conductive film 42 to the lid 14 and further to the main body 11 via a mounting member such as a screw, each of which is made of metal, the electric charge does not affect observation.

For example, the insulating film 41 may be a thin film of silicon oxide (SiO$_2$) or alumina (Al$_2$O$_3$) and the conductive film 42 may be a thin amorphous carbon film, allowing the light irradiation unit to have an antistatic function due to electron beams without significantly affecting the quantity of light from the light emitting element 31.

Modification 2

Figure 4:
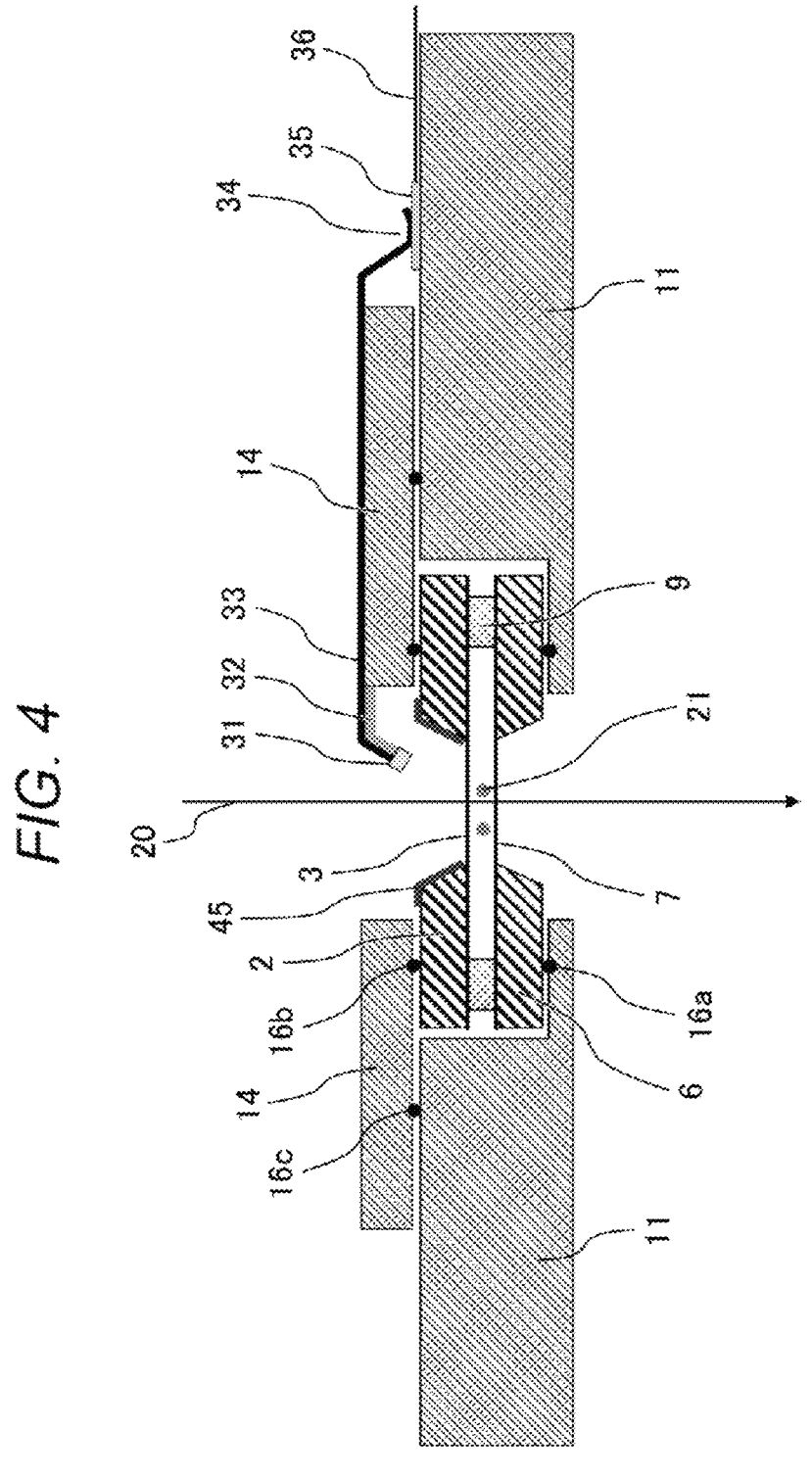
FIG. 4 is a schematic diagram of a sample holder (part) having a light irradiation function.

In the case in which the quantity of light irradiated onto the sample 21 is quantitatively analyzed, it is necessary to prevent the light reflected from the side surface of the opening of the frame 2 from irradiating to the sample 21. FIG. 4 is an example in which the side surface of the opening of the upper Si chip 1 is made to be a reflection suppressing portion 45 that suppresses reflection of light. In order to form the reflection suppressing portion 45, a low reflection material matching the shape of the opening of the frame 2 may be fitted into the opening of the frame 2, or a low reflection material may be deposited or applied to the opening of the frame 2. For example, such a form is possible in which a low reflection member that is an aluminum thin film shaped to match the opening of the frame 2 and coated with carbon is fit into the opening of the frame 2, or deposit carbon is deposited in the opening of the frame 2. The low-reflection member and the low-reflection material are not limited to the example materials, and may be any material that absorbs more light from the light emitting element 31 than single crystal silicon. Although the light irradiation unit in FIG. 4 is configured in the same manner as in FIG. 1, the light irradiation unit of Modification 1 may be configured to have an antistatic function.

Modification 3

Figure 5:
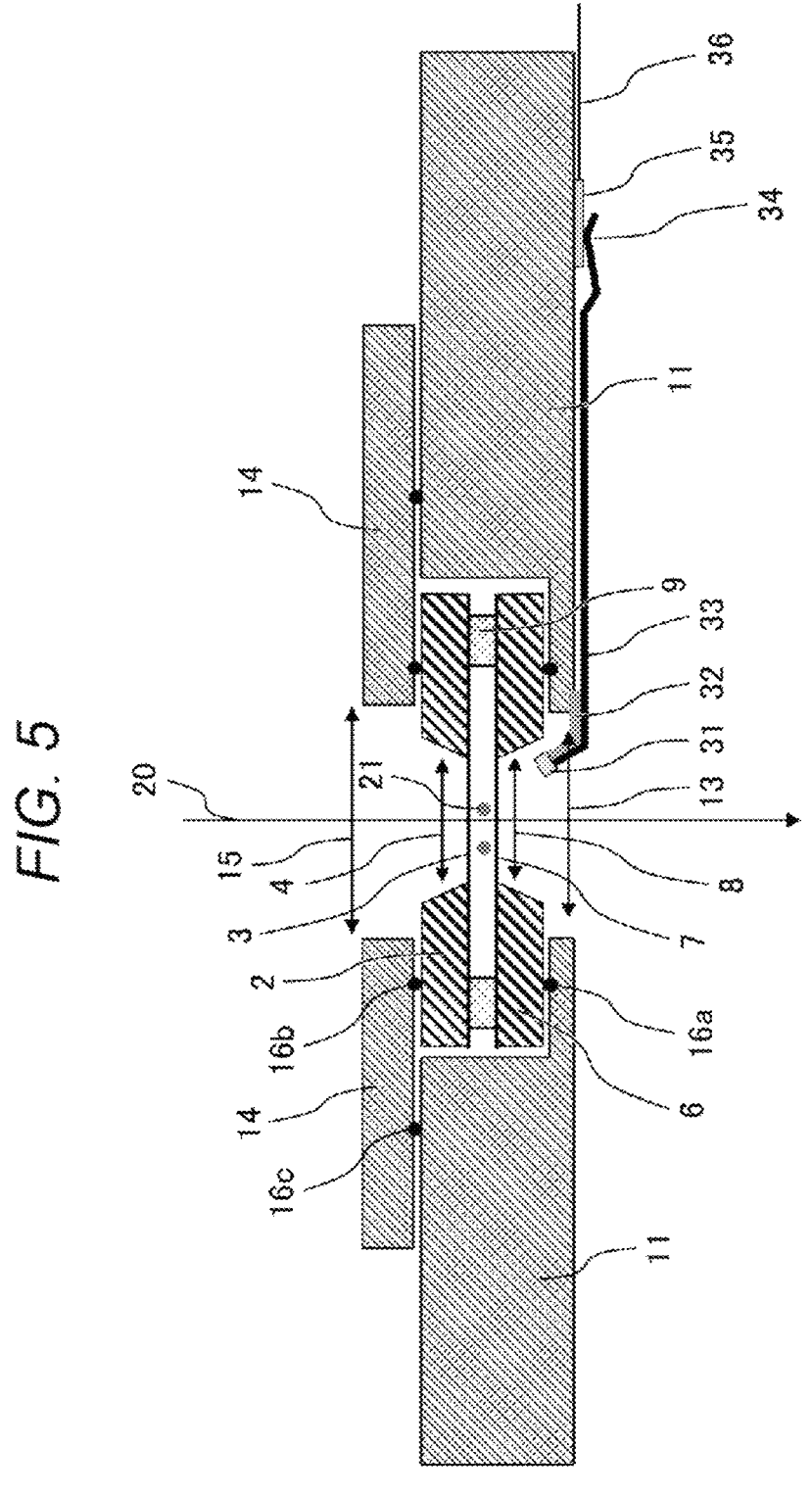
FIG. 5 is a schematic diagram of a sample holder (part) having a light irradiation function.

In FIG. 5, the light emitting element 31 is arranged from the bottom, and the support member 32, the first wiring 33, the first electrode 34, the second electrode 35, and the second wiring 36 are attached to the main body 11 side. By configuring the support member 32 in the same manner as the example in FIG. 1, it becomes possible to irradiate higher luminous light. In the case in which the light emitting element 31 is attached to the main body 11 via the support member 32, one or more of the following (1) to (3) have be satisfied such that the sample 21 is irradiated with higher luminous light.

(1) Since the opening 13 of the main body 11 is larger than the opening 8 of the lower Si chip 5, the support member 32 causes the light emitting element 31 to protrude to the optical axis 20 side from the edge of the opening 13 of the main body 11.

(2) Since the first wiring 33 is arranged to pass through the lower surface of the main body 11, the light emitting element 31 is arranged above the lower surface of the main body 11 by the support member 32.

(3) The light emitted by the light emitting element 31 has directivity. For this reason, the light emitting element 31 is attached to the support member 32 such that the sample 21 is located in the direction where the light quantity of the light emitting element 31 is high.

Further, in FIG. 5, although the light irradiation unit is configured in the same manner as in FIG. 1, it is possible to configure the light irradiation unit as Modification 1, Modification 2, or a combination of the modifications.

This modification is effective when there is not enough space above the sample holder due to the arrangement of a detector, for example. In addition, even though the wiring is provided on the main body 11 side, by connecting the light emitting element 31 to the power source via the first electrode 34 and the second electrode 35, it is possible to replace the light emitting element 31 easily when the light emitting element 31 breaks down.

Figure 6:
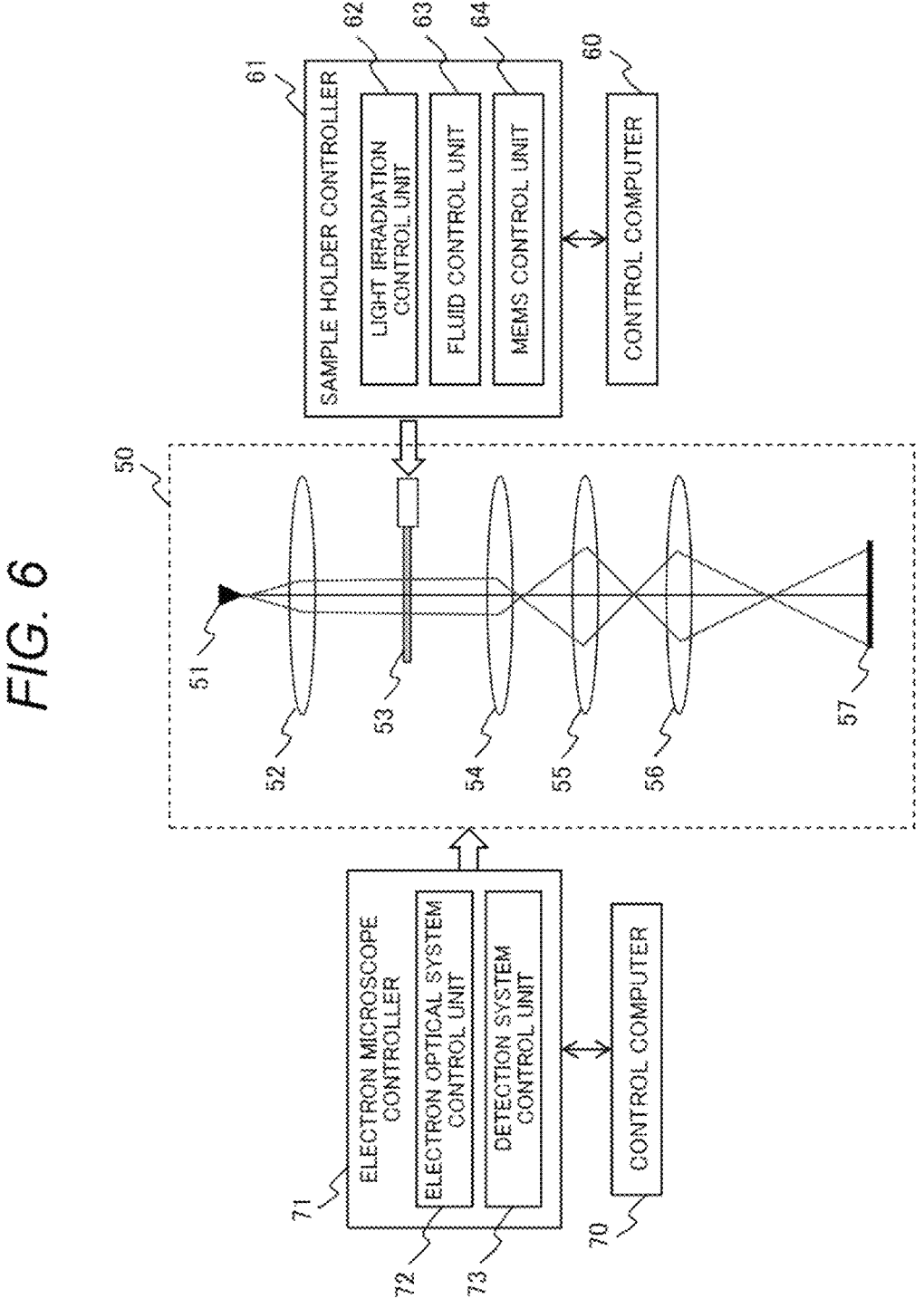
FIG. 6 is a schematic block diagram of an electron microscope equipped with a sample holder having a light irradiation function.

FIG. 6 shows a configuration example of an electron microscope equipped with the sample holder having the light irradiation function according to the present embodiment. The electron optical system of a column 50 is a schematic representation of the electron optical system of a TEM. The electron optical system includes an electron source 51, a condenser lens 52, an objective lens 54, an intermediate lens 55, and a projection lens 56, and a camera 57. When optical conditions and detection conditions for observation are set by a control computer 70, an electron optical system control unit 72, a detection system control unit 73, and the like included in an electron microscope controller 71 control the electron optical system and detection system of the column 50 according to these conditions to perform observation. The obtained image is displayed on a monitor included in the control computer 70.

On the other hand, a sample holder 53 equipped with an environment cell containing a sample to be observed is inserted into a predetermined place of the column 50. Note that for convenience of drawing, the sample holder 53 is shown to be located between the condenser lens 52 and the objective lens 54, but as mentioned above, in the TEM, the sample holder 53 is generally placed between the upper magnetic pole and the lower magnetic pole of the objective lens. When the environmental conditions for in-situ observation are set from a control computer 60, a light irradiation control unit 62, a fluid control unit 63, a MEMS control unit 64, and the like included in a sample holder controller 61 control the light irradiated to the environmental cell, the flow rate and velocity of gas and liquid, heating by the heater, and voltage applied to the sample according to these conditions, and control the environment of the sample for in-situ observation. Note that the control computer 60 may also be used as the control computer 70.

The present invention is not limited to the embodiment described above, and includes various modifications. For example, the embodiment described above is described in detail to explain the present invention in an easy-to-understand manner, and the present invention is not necessarily limited to having all the configurations described. Furthermore, it is possible to add, remove, or replace some of the configurations of the embodiment with other configurations.

Industrial Applicability

The sample holder with the light irradiation function of the present embodiment described above is applied to electron microscopy observation of a sample in a gas or liquid with light applied to the sample, for example, and it is possible to observe fine behavior during reactions in catalysts and electrodes and electromagnetic fields at the atomic level. The observation function, which is newly realized by the electron microscope using the present invention, will elucidate the mechanism of catalysts, for example, and it is expected that this technology will contribute to the development of fuel cells and $CO_2$ fuel conversion catalysts with high performance and high durability; which is necessary to realize the carbon-neutral society that will be demanded worldwide in the future.

REFERENCE SIGNS LIST

1: upper Si chip, 2, 6: frame, 3, 7: membrane, 4, 8: opening, 5: lower Si chip, 9: spacer, 11: main body, 12: recess, 13, 15: opening, 14: lid, 16: O-ring, 20: optical axis, 21: sample, 31: light emitting element, 32: support member, 33: lid side wiring (first wiring), 34: lid side electrode (first electrode), 35: main body side electrode (second electrode), 36: main body side wiring (second wiring), 41: insulating film, 42: conductive film, 45: reflection suppressing portion, 50: column, 51: electron source, 52: condenser lens, 53: sample holder, 54: objective lens, 55: intermediate lens, 56: projection lens, 57: camera, 60, 70: control computer, 61: sample holder controller, 62: light irradiation control unit, 63: fluid control unit, 64: MEMS control unit, 71: electron microscope controller, 72: electron optical system control unit, 73: detection system control unit

What is claimed is:

1. A sample holder that holds an environment cell enclosing a sample, which is an observation target by an electron microscope, the sample holder comprising:

a main body provided with a recess capable of accommodating the environment cell;

a lid that fixes the environment cell accommodated in the recess; and a light irradiation unit that irradiates the sample with light, wherein: openings are provided to a bottom surface of the recess of the main body and to the lid, respectively, the environment cell is formed in combination of a first silicon chip and a second silicon chip, each including a membrane and a frame supporting the membrane, the frame being provided on the opening, in which a space enclosing the sample between the membrane of the first silicon chip and the membrane of the second silicon chip, and an opening of the lid, an opening of the first silicon chip, an opening of the second silicon chip, and an opening of the main body are located so as to overlap with each other along an optical axis of an electron beam of the electron microscope, the second silicon chip is arranged on the main body via a sealing material, the lid is fixed to the first silicon chip and the main body via sealing materials respectively and the light irradiation unit includes a light emitting element is placed at a position where the opening of the first silicon chip or the opening of the second silicon chip is allowed to be irradiated with light.

2. The sample holder according to claim 1, wherein the light irradiation unit includes a support member that attaches the light emitting element to the lid or the main body, and the light emitting element is attached to the support member such that the sample is located in a direction where a light quantity of the light emitting element is high.

3. The sample holder according to claim 2, wherein when the light emitting element is attached to the lid, the support member positions the light emitting element on a side of the optical axis from an edge of the opening of the lid, whereas when the light emitting element is attached to the main body, the support member positions the light emitting element on a side of the optical axis from an edge of the opening of the main body.

4. The sample holder according to claim 3, wherein when the light emitting element is attached to the lid, the support member positions the light emitting element on a lower side from a top surface of the lid, whereas when the light emitting element is attached to the main body, the support member positions the light emitting element on an upper side from the lower surface of the main body.

5. The sample holder according to claim 1, wherein: the light irradiation unit includes a support member that attaches the light emitting element to the lid or the main body and a wiring that supplies a power source to the light emitting element, and at least a part of the light emitting element, the support member and the wiring is covered with an insulating film, and the insulating film is further covered with a conductive film.

6. The sample holder according to claim 1, wherein: when the light emitting element irradiates the opening of the first silicon chip with light, a side surface of the opening of the frame of the first silicon chip is a reflection suppressing portion; and when the light emitting element irradiates the opening of the second silicon chip with light, a side surface of the opening of the frame of the second silicon chip is a reflection suppressing portion.

7. The sample holder according to claim 6, wherein: in order to form the side surface of the opening of the silicon chip as the reflection suppressing portion, a low reflection member in a shape matching with the opening of the silicon chip is fit into the opening of the silicon chip, or a low reflection material is deposited or coated to the opening of the silicon chip; and the low reflection member or the low reflection material is a material that absorbs more light from the light emitting element than silicon single crystal.

8. The sample holder according to claim 1, wherein the main body has a built-in piping that supplies a gas or liquid to a space enclosing the sample of the environment cell.

9. The sample holder according to claim 1, wherein the light emitting element is a light emitting diode (LED).

10. An electron microscope mounting the sample holder according to claim 1.

11. The electron microscope according to claim 10, wherein the sample holder is inserted between an upper magnetic pole and a lower magnetic pole of an objective lens.

* * * * *